(12) United States Patent
Park

(10) Patent No.: US 6,418,064 B1
(45) Date of Patent: Jul. 9, 2002

(54) SENSE AMPLIFIER OUTPUT CONTROL CIRCUIT

(75) Inventor: Kyu-Ha Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/972,036

(22) Filed: Oct. 9, 2001

(30) Foreign Application Priority Data

Oct. 10, 2000 (KR) .............................................. 00-59513

(51) Int. Cl.[7] .............................................. G11C 16/04
(52) U.S. Cl. .................... 365/189.05; 365/205; 365/207
(58) Field of Search ........................... 365/189.05, 205, 365/207, 189.07; 327/57; 326/40

(56) References Cited

U.S. PATENT DOCUMENTS 6,009,020 A * 12/1999 Nagata .................. 365/189.05

* cited by examiner

Primary Examiner—David Lam
(74) Attorney, Agent, or Firm—Jacobson Holman, PLLC

(57) ABSTRACT

A sense amplifier output control circuit capable of outputting data from the sense amplifier without delaying. The sense amplifier output control circuit includes a first logical operating element receiving an inverted output of the sense amplifier and a first controlling signal; a flip-flop circuit including a second logical operating element and a third logical operating element, the second logical operating element receiving signals from the first logical operating element and the third logical operating element, and the third logical operating element receives a signal from the second logical operating element and the first controlling signal; a fourth logical operating element receiving a signal from the flip-flop circuit and a second control signal; and a fifth logical operating element for inverting a signal from the fourth logical operating element. An output terminal of the fifth logical operating element is connected to an input terminal of the sense amplifier.

7 Claims, 6 Drawing Sheets

SENSE AMPLIFIER OUTPUT CONTROL CIRCUIT

BACKGROUND OF THE INVENTION

1. Field of the Invention

The present invention relates to a semiconductor memory device and, more particularly, to a sense amplifier output control circuit.

2. Description of the Prior Art

FIG. 1 is a schematic diagram of a conventional sense amplifier and sense amplifier output control circuit. The sense amplifier 11 compares an input signal IN with a reference signal REF and generates a sense-amplifier-output (SAOUT) signal in response to a sense-amplifier-enable-bar (SAENb) signal. A first NMOS transistor N11 transfers the SAOUT signal to a latch circuit 12 in response to a latch-enable (LATCHEN) signal. The latch circuit 12 comprises three inverters I11, I12 and I13. The SAOUT signal, transferred to the latch circuit 12 through the first NMOS transistor N11, is delayed by the first inverter I11 and the second inverter I12 for a predetermined time. The delayed SAOUT signal is inverted by the third inverter I13. The output signal from the latch circuit 12 is transferred to the output terminal OUT through a second NMOS transistor N12 driven by an output-enable (OUTEN) signal. The OUTEN signal is inverted by a fourth inverter I14 and is inputted to a third NMOS transistor N13 coupling the output terminal OUT and a ground voltage potential Vss, in order to control the potential of the output terminal OUT.

The conventional driving method of the sense amplifier output control circuit is described in conjunction with FIGS. 2A to 2C showing the output waveforms of the signals identified above.

The LATCHEN signal is generated in expectation of the output time of the SAOUT signal. The first NMOS transistor N11 is driven by the LATCHEN signal, and the SAOUT signal is stored in the latch circuit 12. Then, the second NMOS transistor N12 is driven by the OUTEN signal and signals are transferred from the latch circuit 12 to the output terminal OUT. If the level of the OUTEN signal is low, the OUTEN signal is inverted to the high level through the fourth inverter I14 and the third NMOS transistor N13 is turned on by the inverted OUTEN signal in order to fix the output terminal OUT to the low level.

It is important to set the time for latching the SAOUT signal during the above-mentioned operation. As shown in FIG. 2A, it is possible to obtain normal data at the output terminal OUT, if the levels of the LATCHEN signal and the OUTEN signal are high, and the SAOUT signal is outputted correctly. However, as shown in FIG. 2B, if the SAOUT signal is generated earlier than the LATCHEN signal, then the signals are outputted to the output terminal OUT only when the supply of the LATCHEN signal is ended and the high level OUTEN signal is supplied.

Further, as shown in FIG. 2C, if the SAOUT signal is outputted after the generation of the LATCHEN signal, then the wrong SAOUT signal corresponding to- the high level LATCEN signal is outputted to the output terminal OUT.

As mentioned above, the data output speed depends on the generation time of the LATCHEN signal, and the wrong data may be outputted to the output terminal OUT, if the LATCHEN signal is generated earlier than the SAOUT signal. In order to solve this problem, the SAOUT signal is directly transferred to data output terminal OUT without passing the latch circuit 12. However, in this case, if the SAOUT signal is changed in an instant by noise, the output data may be delayed by tens of nano-seconds even though the correct data is outputted again a little later, because time is needed to drive a large output driver transistor. That is, the prior art has the disadvantage of possible glitches caused by noise.

SUMMARY OF THE INVENTION

It is an object of the present invention to provide a sense amplifier output control circuit capable of outputting data from the sense amplifier without unwanted delays.

It is another object of the present invention to provide a sense amplifier output control circuit with reduced malfunction and power supply requirement.

In accordance with one aspect of the present invention, there is provided a sense amplifier output control circuit comprising a first logical operating means receiving an inverted output of the sense amplifier and a first control signal; a flip-flop means including a second logical operating means and a third logical operating means, wherein the second logical operating means receives signals from the first logical operating means and the third logical operating means, and wherein the third logical operating means receives signals from the second logical operating means and the first control signal; a fourth logical operating means receiving a signal from the flip-flop means and a second control signal; and a fifth logical operating means for inverting a signal from the fourth logical operating means, wherein an output terminal of the fifth logical operating means is connected to an input terminal of the sense amplifier.

In accordance with another aspect of the present invention, there is provided a semiconductor memory device, comprising a memory cell; a sense amplifier receiving a signal from the memory cell; a first. logical operating means for inverting a signal from the sense amplifier; a second logical operating means for non-disjunction of a signal from the first logical operating means and a first control signal; a flip-flop means receiving a signal from the second logical operating means and the first control signal; a third logical operating means for non-disjunction of a signal from the flip-flop means and a second control signal; and a fourth logical operating means for inverting a signal from the third logical operating means, wherein an output terminal of the fourth logical operating means is connected to an input terminal of the sense amplifier.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

The sense amplifier output control circuit according to the present invention is formed to monitor the output of the sense amplifier and to output high level data, at the moment of changing the output signal of the sense amplifier from a low level to a high level, and to ignore the output of the sense amplifier after the moment of changing. The sense amplifier output control circuit according to the present invention is also formed to output a low level of data output signal continuously if the sense-amplifier-output-signal remains at a low level. A high level output-enable-signal is inputted to the sense amplifier for stopping the operation of the sense amplifier at the moment of changing the output signal of the sense amplifier from a low level to a high level.

Hereinafter, the sense amplifier output control circuit according to the present invention will be described in detail referring to the accompanying drawings.

Figure 1:
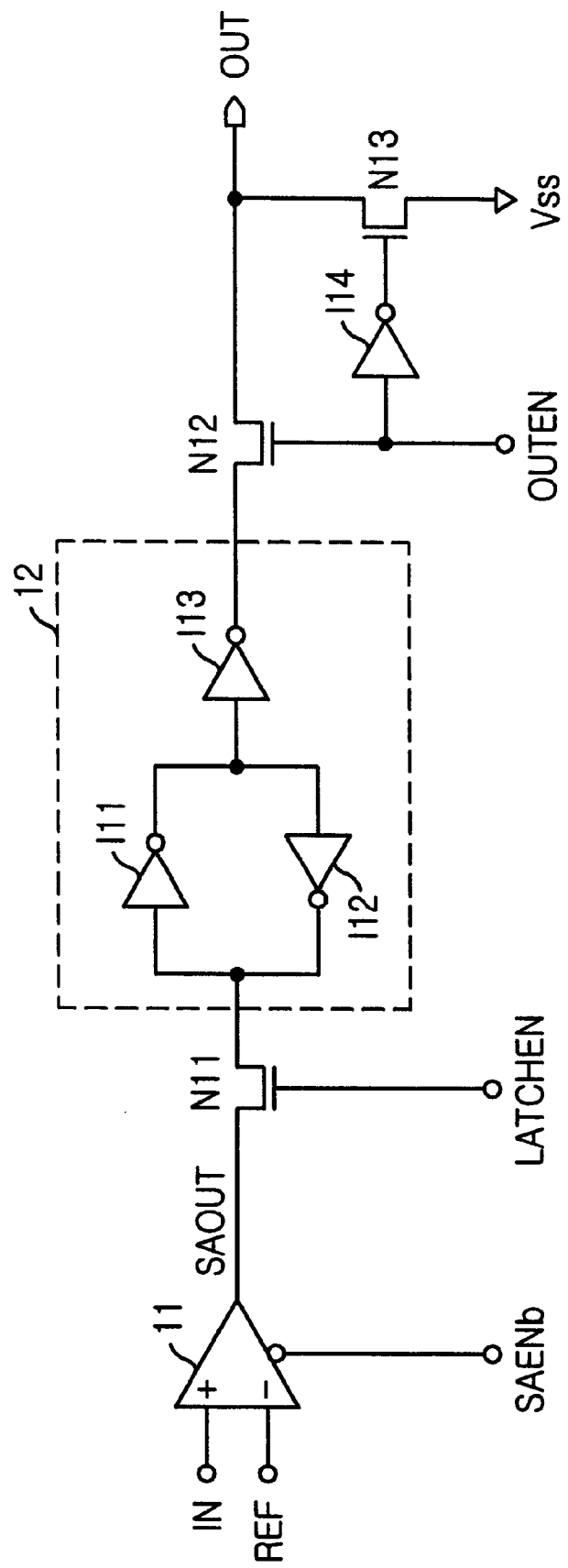
FIG. 1 is a schematic diagram of a conventional sense amplifier and sense amplifier output control circuit.
Figure 2A:
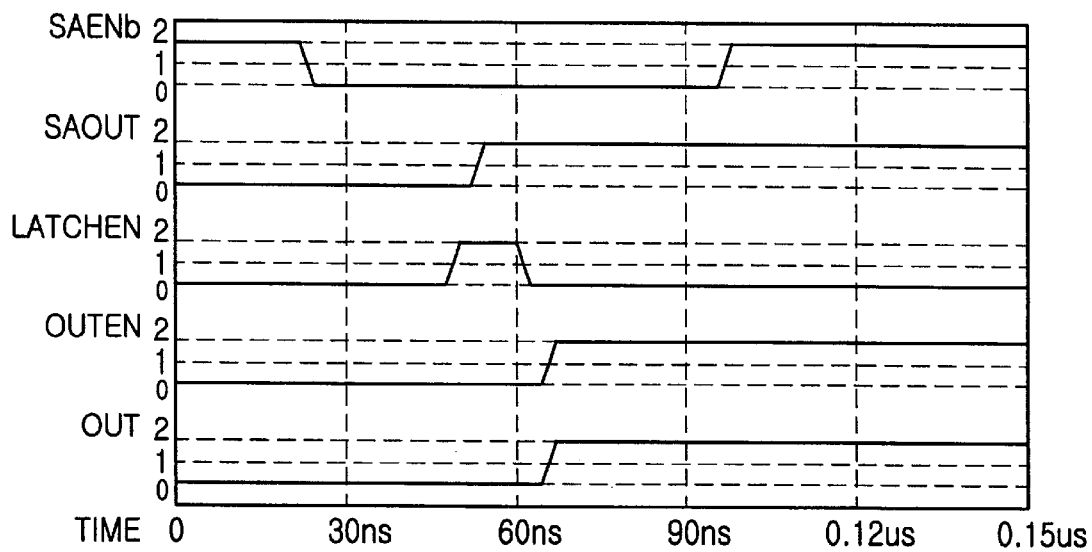
FIGS. 2A to 2C are graphs illustrating the output waveforms of the signals generated by the conventional sense amplifier output control circuit.
Figure 2B:
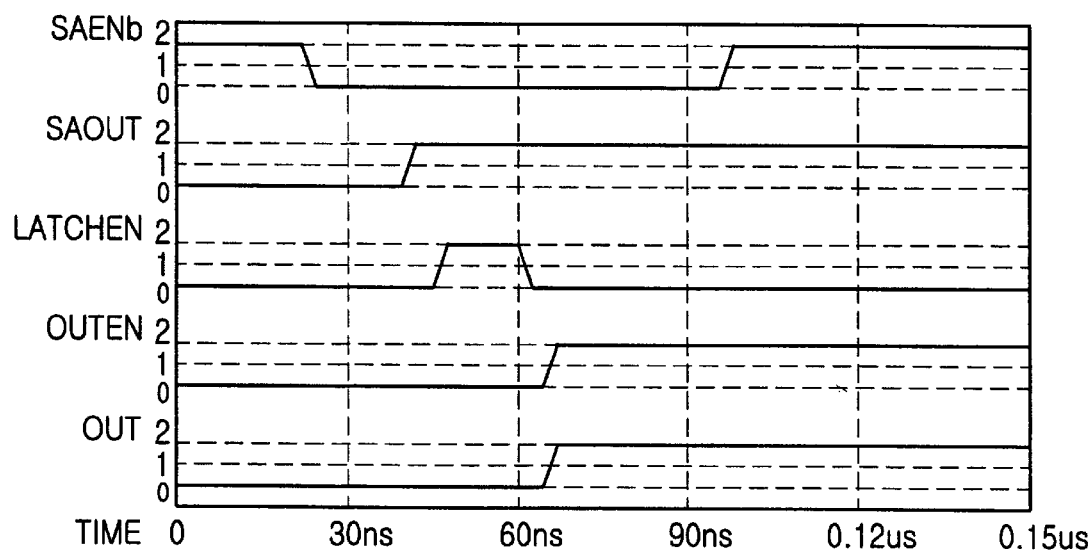
Figure 2C:
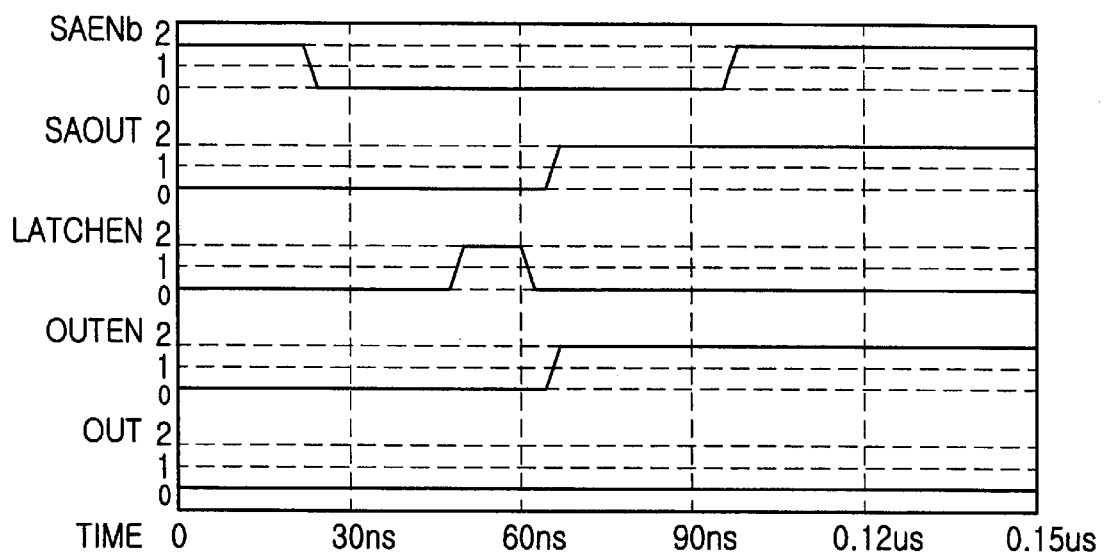
Figure 3:
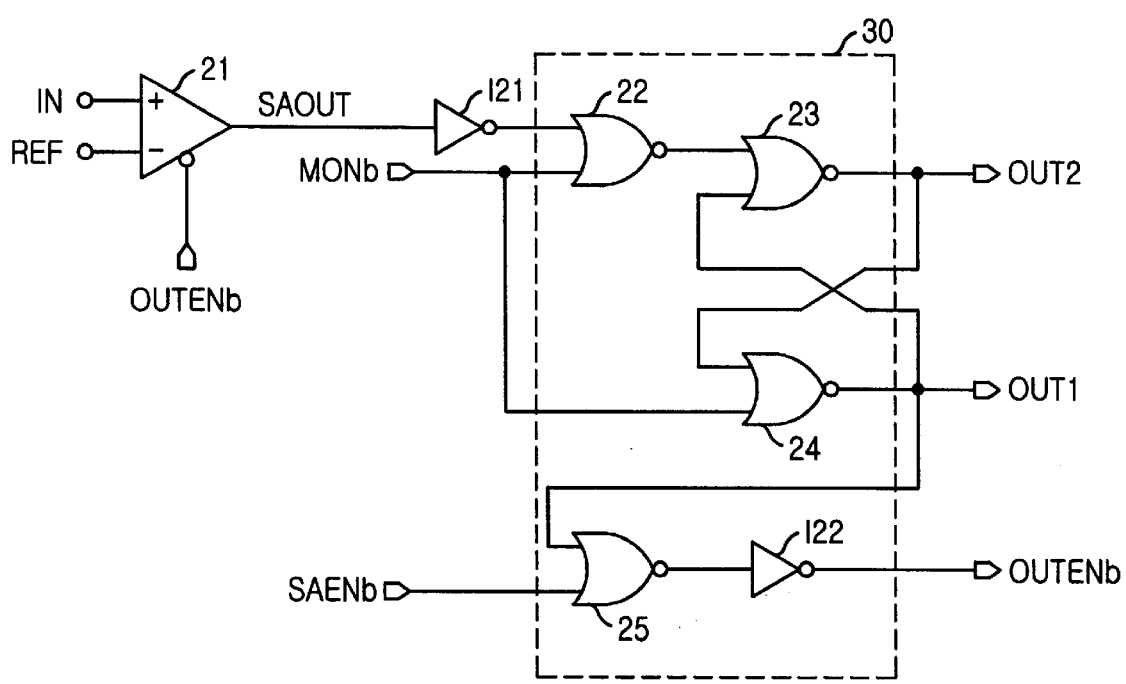
FIG. 3 is a schematic diagram of a sense amplifier and a sense amplifier output control circuit in accordance with the present invention.

FIG. 3 is a schematic diagram of the sense amplifier output control circuit according to the present invention.

A sense amplifier 21 is coupled to a sense-amplifier-output-control-circuit 30 through a first inverter I21. The sense-amplifier-output-control-circuit 30 comprises a first NOR gate 22, a flip-flop circuit including a second NOR gate 23 and a third NOR gate 24, a fourth NOR gate 25 and a second inverter I22. The first NOR gate 22 receives a signal from the first inverter I21 and a monitoring-bar-signal MONb, i.e., a first control signal. The second NOR gate 23 receives signals from the first inverter I21 and the third NOR gate 24 and outputs a data-output-bar-signal OUT2. The third NOR gate 24 receives a signal from the second NOR gate 23 and from the monitoring-bar-signal MONb and outputs a data-output-signal OUT1. The fourth NOR gate 25 receives a signal from the third NOR gate 24 and a sense-amplifier-enable-signal SAENb, i.e., a second control signal. The second inverter I22 generates an output-enable-bar-signal OUTENb, which is inputted to the sense amplifier.

The sense amplifier 21 compares an input signal IN with a reference signal REF and generates the sense-amplifier-output-signal SAOUT, and the operation thereof is stopped in response to an output-enable-bar-signal OUTENb.

The first inverter I21 is connected to the sense amplifier 21 and receives and inverts the sense-amplifier-output-signal SAOUT. The first NOR gate 22 receives a signal from the first inverter I21 and the monitoring bar signal MONb.

The driving method of the sense amplifier output control circuit according to the present invention is now described in detail.

First, it is assumed that the high level monitoring-bar-signal MONb and the low level sense-amplifier-output-signal SAOUT are applied to the sense amplifier output control circuit 30 in the following description. The low level sense-amplifier-output-signal SAOUT is inverted by the first inverter I21. The first NOR gate 22 receives the inverted sense-amplifier-output-signal SAOUT from the first inverter I21 and the high level monitoring-bar-signal MONb and outputs a low level signal.

The low level signal outputted by the first NOR gate 22 is inverted by the second NOR gate 23, and a high level data-output-bar-signal OUT2 is generated by the second NOR gate 23. The third NOR gate 24 receives the high level data-output-bar signal OUT2 and the monitoring-bar signal MONb and outputs a low level data-output-signal OUT1. The low level data-output-signal OUT1 is inputted to the second NOR gate 23 and the fourth NOR gate 25. The fourth NOR gate 25 receives the low level data-output-signal OUT1 and the sense-amplifier-enable-bar signal SAENb and outputs a signal of high level. The second inverter I22 receives and inverts the signal of high level from the fourth NOR gate 25 to generate the low level output-enable-signal OUTENb. The sense amplifier 21 is operated by the low level output-enable-signal OUTENb.

Second, it is assumed that the high level monitoring-bar-signal MONb and the high level sense-amplifier-output-signal SAOUT are applied to the sense amplifier output control circuit 30, in the following description. The high level sense-amplifier-output-signal SAOUT is inverted by the first inverter I21. The first NOR gate 22 receives the low level sense-amplifier-output-signal SAOUT from the first inverter I21 and the high level monitoring-bar-signal MONb and outputs a low level signal. The low level signal outputted from the first NOR gate 22 is inverted by the second NOR gate 23, and a high level data-output-bar-signal OUT2 is generated by the second NOR gate 23. The third NOR gate 24 receives the high level data-output-bar-signal OUT2 and the high level monitoring-bar-signal MONb and outputs the low level data-output-signal OUT1. The low level data-output-signal OUT1 is inputted to the second NOR gate 23 and to the fourth NOR gate 25. The fourth NOR gate 25, receiving the low level data-output-signal OUT1 and the sense-amplifier-enable-bar-signal SAENb, outputs a high level signal. The second inverter I22 receives and inverts the high level signal from the fourth NOR gate 25 to generate the low level output-enable-signal OUTENb. The sense amplifier 21 is operated by the low level output-enable-signal OUTENb.

Third, it is assumed that the low level monitoring-bar-signal MONb and the low level sense-amplifier-output-signal SAOUT are applied to the sense amplifier output control circuit 30 in the following description. The low level sense-amplifier-output-signal SAOUT is inverted to high level by the first inverter I21. The first NOR gate 22 receives the high level sense-amplifier-output-signal SAOUT from the first inverter I21 and the low level monitoring bar signal MONb and outputs a signal of low level. The low level signal outputted by the first NOR gate 22 is inverted by the second NOR gate 23, and the high level data-output-bar-signal OUT2 is generated by the second NOR gate 23. The third NOR gate 24 receives the high level data-output-bar-signal OUT2 and the low level monitoring-bar-signal MONb and outputs the low level data-output-signal OUT1. The low level data-output-signal OUT1 is inputted to the second NOR gate 23 and to the fourth NOR gate 25. The fourth NOR gate 25, receiving the low level data-output-signal OUT1 and the low level sense-amplifier-enable-bar signal SAENb, outputs a high level signal. The second inverter I22 receives and inverts the high level signal from the fourth NOR gate 25 to generate a low level output-enable-signal OUTENb. The sense amplifier 21 is operated by the low level output-enable-signal OUTENb.

Fourth, it is assumed that the low level monitoring-bar-signal MONb and the high level sense-amplifier-output-signal SAOUT are applied to the sense amplifier output control circuit 30 in the following description. The high level sense-amplifier-output-signal SAOUT is inverted to the low level by the first inverter I21. The first NOR gate 22 receives the low level sense-amplifier-output-signal SAOUT from the first inverter I21 and the low level monitoring bar signal MONb and outputs a high level signal. The high level signal outputted by the first NOR gate 22 is inverted by the second NOR gate 23, and the low level data-output-bar-signal OUT2 is generated by the second NOR gate 23. The third NOR gate 24 receives the low level data-output-bar-signal OUT2 and the low level monitoring-bar-signal MONb and outputs the high level data-output-signal OUT1. The high level data-output-signal OUT1 is inputted to the second NOR gate 23 and to the fourth NOR gate 25. The fourth NOR gate 25, receiving the high level data-output-signal OUT1 and the low level sense-amplifier-enablebar signal SAENb, outputs a low level signal. The second inverter I22 receives and inverts the low level signal from the fourth NOR gate 25 to generate a high level output-enable-signal OUTENb. The sense amplifier 21 is stopped by the high level output-enable-signal OUTENb.

As mentioned above, when the high level monitoring-bar-signal MONb is applied to the first inverter I12 receiving the inverted sense-amplifier-output-signal SAOUT, the low level data-output-signal OUT1 is generated independently of the level of the sense-amplifier-output-signal SAOUT. If the low level monitoring-bar-signal MONb is applied to the first inverter I12 receiving the inverted sense-amplifier-output-signal SAOUT, the low level data-output-signal OUT1 is generated if the sense-amplifier-output-signal SAOUT is at the low level. If the sense amplifier 21 outputs the high level sense-amplifier-output-signal SAOUT and the low level monitoring-bar-signal MONb is applied to the first NOR gate 22 receiving the inverted sense-amplifier-output-signal SAOUT from the first inverter I21, then the high level data-output-signal OUT1 is outputted and the high level output-enable-bar-signal OUTENb is also outputted to stop the operation of the sense amplifier 21. Accordingly, it is possible to prevent unnecessary operation of the sense amplifier and to reduce the power consumption.

FIGS. 4A to 4D are graphs illustrating the output waveforms of the signals mentioned above.

Figure 4A:
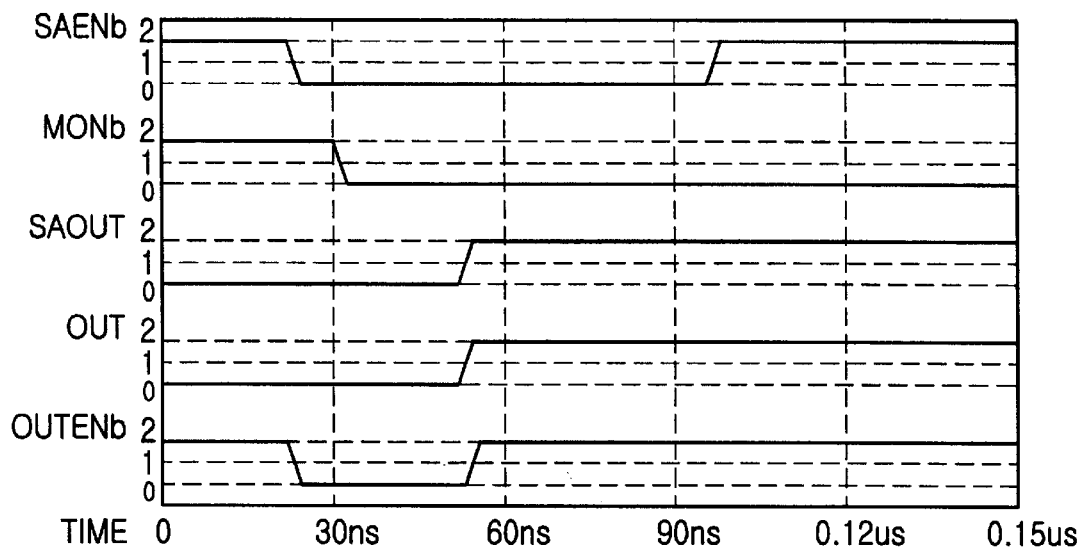
FIGS. 4A to 4D are graphs illustrating the output waveforms of the signals generated by the sense amplifier output control circuit of FIG. 3.

FIG. 4A shows the output waveforms of normal condition. The sense amplifier 21 is operated in response to the low level sense-amplifier-enable-signal SAENb, and the sense-amplifier-output-signal SAOUT is outputted from the sense amplifier 21 a little later. The level of the sense-amplifier-output-signal SAOUT becomes high shortly after applying the low level monitoring-bar-signal MONb. The high level data-output-signal OUT1 is generated by the sense-amplifier-output-control-circuit 30 and the high level output-enable-bar-signal OUTENb is also generated by the sense-amplifier-output-control-circuit 30 in order to stop the operation of the sense amplifier 21.

Figure 4B:
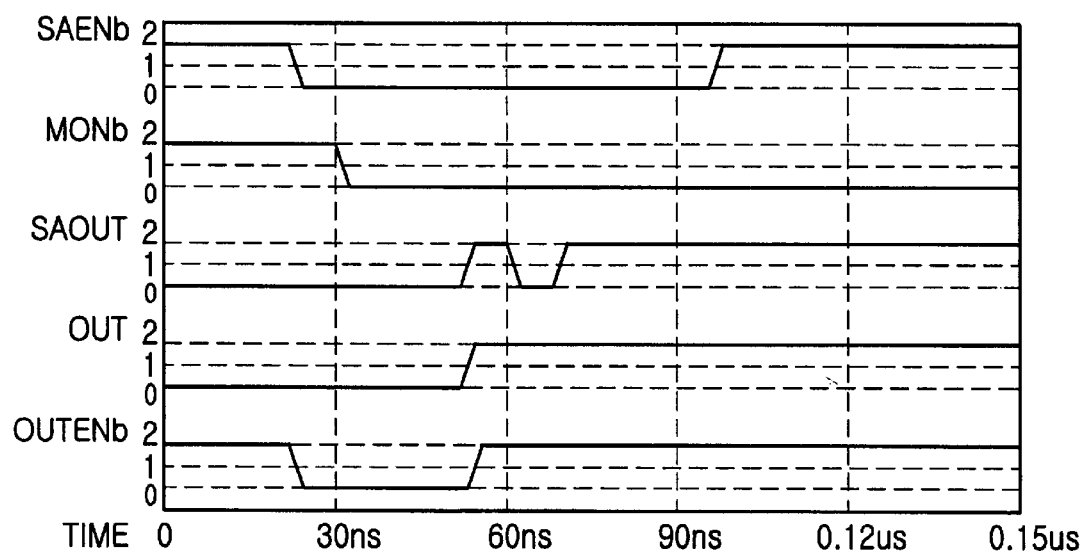

FIG. 4B shows the output waveforms in the case of generating a glitch, even though the sense-amplifier-output-signal SAOUT is inverted to the high level while the low level monitoring-bar-signal MONb is applied. The high level data-output-signal OUT1 is generated at the moment that the sense-amplifier-output-signal SAOUT is inverted. After that, the signals from the sense amplifier 21 are ignored and the output-enable-bar-signal OUTENb is generated to stop the operation of the sense amplifier 21.

Figure 4C:
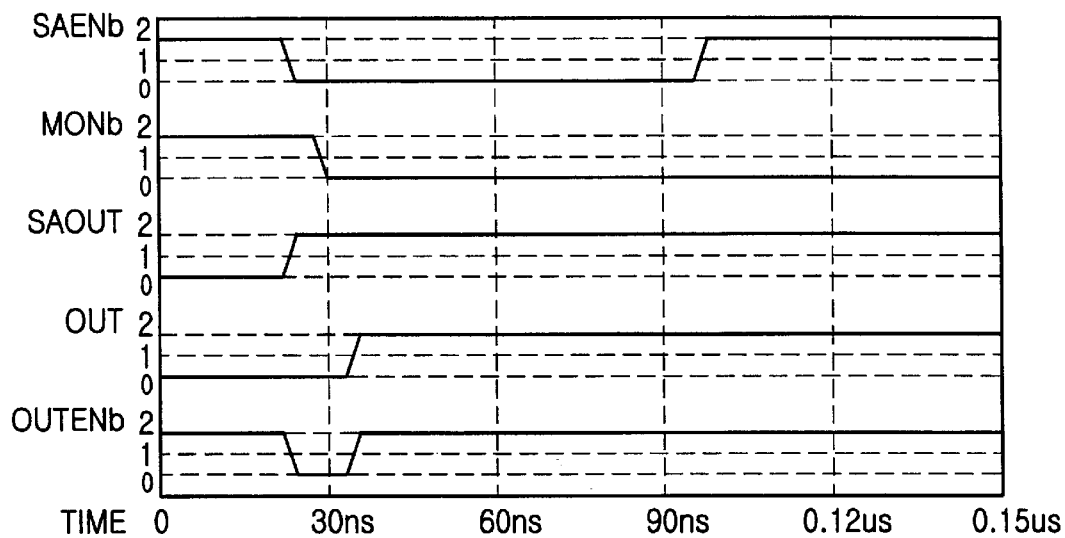

FIG. 4C shows the output waveforms in case that the level of the sense-amplifier-output-signal SAOUT becomes high level before applying the low level monitoring-bar-signal MONb, i.e., before the monitoring period. The sense-amplifier-output-signal SAOUT is outputted as data-output-signal OUT1 and the high level output-enable-bar-signal OUTENb is outputted to stop the operation of the sense amplifier 21, at the moment that a low level monitoring-bar-signal MONb and a high level sense-amplifier-output-signal SAOUT are applied.

Figure 4D:
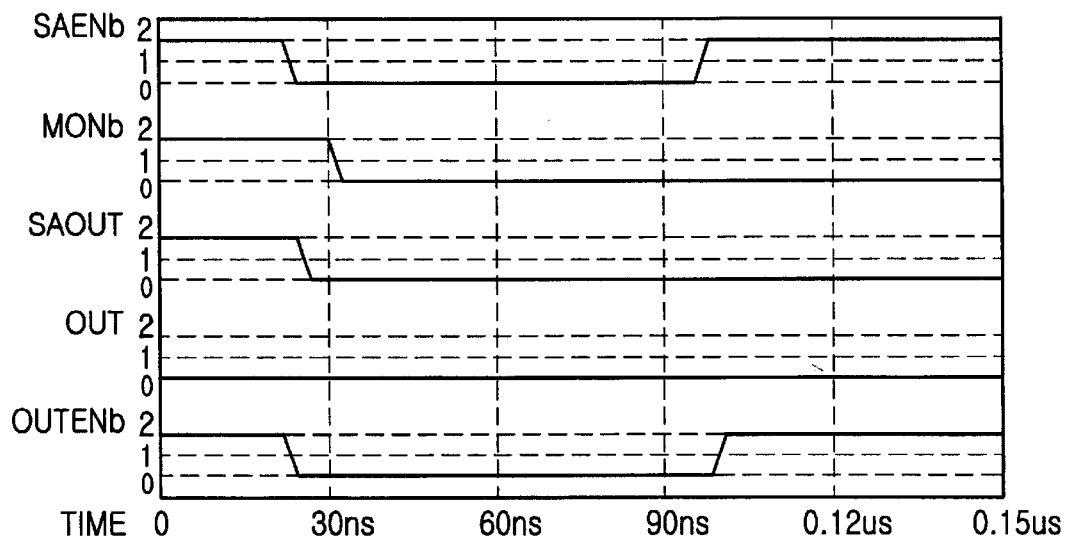

FIG. 4D shows the output waveforms in case that the level of the sense-amplifier-output-signal SAOUT remains continuously at the high level for the monitoring period and the level of the real output-data-signal OUT1 is low. In this case, the effective data-output-signal OUT1 remains continuously at the low level as determined initial state, the output-enable-bar-signal OUTENb is the same as the sense-amplifier-enable-bar-signal SAENb.

Therefore, the data output speed may be increased by using the sense-amplifier-output-control-circuit of the present invention, as compared with that of the conventional semiconductor memory device adopting the latch circuit. Further, the interruption caused by the noise may be reduced by maintaining the state of the sense-amplifier-output-signal to high level. It is possible to reduce power consumption by stopping the operation of the sense amplifier at the moment of changing the state of the data-output-signal from low to high level.

While the present invention has been described with respect to the particular embodiments, it will be apparent to those skilled in the art that various changes and modifications may be made without departing from the scope of the invention as defined in the following claims.

What is claimed is:

1. A sense amplifier output control circuit for a sense amplifier comprising:

a first logical operating element receiving an inverted output of the sense amplifier and a first controlling signal;

a flip-flop circuit including a second logical operating element and a third logical operating element, the second logical operating element receiving signals from the first logical operating element and the third logical operating element, and the third logical operating element receiving a signal from the second logical operating element and the first controlling signal;

a fourth logical operating element receiving a signal from the flip-flop circuit and a second control signal; and a fifth logical operating element for inverting a signal from the fourth logical operating element, an output terminal of the fifth logical operating element being connected to an input terminal of the sense amplifier.

2. The sense amplifier output control circuit in accordance with claim 1, wherein the first, the second, the third and fourth logical operating elements are NOR gates.

3. The sense amplifier output control circuit in accordance with claim 1, wherein the second logical operating element outputs a data-output-bar-signal and the third logical operating element outputs a data-output-signal.

4. A semiconductor memory device, comprising:

a memory cell;

a sense amplifier receiving data from the memory cell;

a first logical operating means for inverting a signal from the sense amplifier;

a second logical operating means for non-disjunction of a signal from the first logical operating means and a first control signal;

a flip-flop circuit receiving a signal from the second logical operating means and the first control signal;

a third logical operating means for non-disjunction of a signal from the flip-flop circuit and a second control signal; and a fourth logical operating means for inverting a signal from the third logical operating means, an output terminal of the fourth logical operating means being connected to an input terminal of the sense amplifier.

5. The semiconductor memory device in accordance with claim 4, wherein the flip-flop circuit includes a fifth logical operating means for inverting a signal received from the second logical operating means, and a sixth logical operating means for receiving signals from the fifth logical operating means and the first control signal.

6. The semiconductor memory device in accordance with claim 4, wherein the second, the third, the fifth and the sixth logical operating means are NOR gates.

7. The semiconductor memory device in accordance with claim 4, wherein the fifth logical operating means outputs a data-output-bar-signal, and the sixth logical operating means outputs a data-output-signal.

\* \* \* \* \*